United States Patent [19]

Yoshikawa et al.

[11] Patent Number: 4,914,080

[45] Date of Patent: Apr. 3, 1990

[54] METHOD FOR FABRICATING SUPERCONDUCTIVE FILM

[75] Inventors: Kohta Yoshikawa, Yokohama; Naoki Awaji; Kyung-ho Park, both of Kawasaki; Nagisa Ohsako; Seigen Ri, both of Yokohama, all of Japan

[73] Assignee: Fujitsu Limited, Kawasaki, Japan

[21] Appl. No.: 300,889

[22] Filed: Jan. 24, 1989

[30] Foreign Application Priority Data

Jan. 27, 1988 [JP] Japan ................................. 63-014387
Jun. 8, 1988 [JP] Japan ................................. 63-140701

[51] Int. Cl.$^4$ .......................... B05D 5/12; C23C 14/08
[52] U.S. Cl. .......................................... 505/1; 427/62; 427/126.3; 427/255.3; 505/732; 505/730; 419/19; 419/20; 419/22; 419/28; 419/33; 419/55
[58] Field of Search ............. 427/62, 63, 126.3, 255.2, 427/255.3; 505/1, 818, 819, 732, 730; 118/715, 726; 419/19, 20, 22, 28, 33, 55

[56] References Cited

U.S. PATENT DOCUMENTS 4,362,767 12/1982 Nouchi et al. .................... 427/255.3
4,377,607 3/1983 Yoshida et al. .................... 427/255.3

OTHER PUBLICATIONS

Tachikawa et al, "High Tc Superconducting Films of Y-Ba-Cu Oxide Prepared by a $CO_2$ Laser Beam Evaporation", MRS vol. 99, Nov. 1987, pp. 723-726.

Koch et al, "Thin Films and Squids Made from $YBa_2Cu_3O_y$", MRS ed. Gubser et al, Apr. 1987 (Anaheim, CA) pp. 81-84.

Maeda et al, "A New High-Tc Oxide Superconductor without a Rare Earth Element", Jpn. J. Appl. Phys. 27(2), Feb. 1988, L209-210.

Primary Examiner—Norman Morgenstern
Assistant Examiner—Roy V. King
Attorney, Agent, or Firm—Armstrong, Nikaido, Marmelstein, Kubovcik & Murray

[57] ABSTRACT

A method for fabricating a superconductive film composed of a $RE_1Ba_2Cu_3O_x$ compound, or a (Bi.Sr.Ca.Cu.O) compound. In a first embodiment, oxides or carbonates of the component materials, namely $Y_2O_3$, $BaCO_3$, and CuO are mixed in atomic ratios of 1:2:3, according to the chemical formula of $RE_1Ba_2Cu_3O_x$, and sintered to create a rhombic perovskite structure. The sintered mixture is powdered again, with added powdered amounts of $Y_2O_3$ and powdered metallic Cu, and sintered. The sintered product is used as the source for an electron beam evaporator. In a second embodiment the (Bi.Sr.Ca.Cu.O) compound is formed into a sintered pellet which is composed of a mixture of one part of BiO, 3-15 parts of $SrCO_3$, 4-30 parts of $CaCO_3$, and 2-5 parts of CuO, in atomic ratios of Bi, Sr, Ca and Cu.

10 Claims, 2 Drawing Sheets

METHOD FOR FABRICATING SUPERCONDUCTIVE FILM

BACKGROUND OF THE INVENTION

1. Field of the Invention

The present invention relates to a method for fabricating superconductive film on a dielectric substrate by electron beam evaporation. The present invention especially relates to a method for fabricating a superconductive film composed of a compound of bismuth, strontium, calcium, copper and oxygen (Bi.Sr.Ca.Cu.0), or a compound composed of rare earth element, barium, copper and oxygen (RE.Ba.Cu.0).

Recently, considerable effort has been made to use superconductive technology in electronic devices. To achieve such an object, great emphasis is placed on fabricating a superconductive film.

2. Description of the Relevant Art

Since the discovery of a material which shows superconductivity at a relatively high temperature by W. K. Wu et al. ["Superconductivity at 93 K in New Mixed-Phase Y—Ba—Cu—O Compound System at Ambient Pressure", *Phys. Rev. Lett.*, 58, No. 9, (1987)], extensive efforts have been made in various fields of industry to discover new materials which can operate at even higher temperatures, and provide a stable operation. Among many of those new materials, compounds of ($RE_1Ba_2Cu_3O_x$), where x is 6–7, and compounds of (Bi Sr.Ca.Cu.O) are considered the most promising compounds for electronic applications.

In fabricating a thin film of these compounds, two methods have been mainly tried, one is sputtering and the other is evaporating the materials. Both methods are widely used in electronic device fabrication. Sputtering is used extensively because a variety of compounds can be subjected to glow discharge of gas.

In the sputtering method, a compound of superconductive material is placed in a chamber as a source, and sputtered by an electrical glow discharge generated between the source and a substrate. Such techniques are more completely described in "Preparation of $YBa_2Cu_3O_{7-x}$ Superconducting Thin Films by Rf-Magnetron Sputtering" by T. Aida et al. *Japanese Jour. Appl. Phys.*, 26, No. 9, L1489-L1491 (1987). The ratio of the number of atoms of the elements RE, Ba, Cu in the compound $RE_1Ba_2Cu_3O_x$, as shown, is 1:2:3. However, if a superconductive material having such an atomic ratio is used for a sputtering source, it has been found that the fabricated film does not show superconductivity, even though the source material exhibits superconductivity. This phenomenon is likely to be attributed to the fact that the sputtering rate of atoms by glow discharge is different for different atoms, and accordingly, the atomic ratio in the sputtered film is shifted from the ideal. To compensate for such a shift in the atomic ratio, it has been proposed to vary the ratio of the components in the source compound as set forth above. This method is discussed in, "Preparation of Y—B—Cu—O Thin Films by Rf-Magnetron Sputtering" by H. Ohkuma et al., *Japanese Jour. Appl. Phys.*, 26, No. 9, L1484–L1486 (1987).

The surfaces of superconductive films formed by sputtering according to the present state-of-the-art technology are found to be rough and lack the smoothness necessary for wiring for electronic devices. This may be due to a back sputtering of the substrate caused by ion bombardment. Further, the sputtering condition varies depending on the structure of the sputtering chamber, arrangement of electrodes in the chamber, pressure of gas, voltage and frequency of the equipment. So, the sputtering condition must be determined for each device used.

With regard to the evaporation method, the source material is evaporated by heating it, and depositing it on a substrate. To heat the material to a temperature of evaporation, a resistance filament heater or an electron beam is used. Recently, electron beam evaporation has been widely used. The surface of the film fabricated by an evaporation method is smooth. Therefore, the evaporated film is preferable for use in electronic devices.

Generally, to fabricate a film of a compound by an evaporation method, component materials, usually metals, are put in respective crucibles, and evaporated separately from each other but usually at the same time toward the substrate. The elements are reacted with each other and form the desired compound on the substrate or on the way to the substrate. By controlling the temperature of each crucible the evaporation rate of each element can be varied. Accordingly, the deviation of the atomic ratio from the desired value can be avoided, but generally, annealing is necessary to obtain a complete compound. Without annealing the produced film does not exhibit superconductivity. Or in order to exhibit superconductivity it is necessary to lower the temperature of the composition to that of liquid helium. The above situation may be seen, for example in "As-deposited Superconducting Y—Ba—Cu—O Thin Films on Si, $Al_2O_3$, and $SrTiO_3$ Substrates" by R. M. Silver et al., *Appl. Phys. Lett.*, 52, (25), (1988).

From a view point of applying superconductivity technology to electronic devices, the operating temperatures of the superconductive film is desirable to be as high as possible. At least it is desirable to operate at the temperature of liquid nitrogen, and it is preferable not to use annealing, because many electronic devices, such a semiconductor devices, do not lend themselves to being heated to high temperatures.

SUMMARY OF THE INVENTION

The object of the present invention, therefore, is to provide a method for fabricating a superconductive film which maintains its superconductivity at the temperature of liquid nitrogen (77° K).

A further object of the present invention is to provide a superconductive film applicable for use in electronic devices. A still further object of the present invention is to provide a method for fabricating a superconductive film by evaporating a single pellet which includes all component materials.

The inventors found that component materials, especially oxide and carbonate compounds can be used as an evaporation source of an electron beam evaporator. The evaporation source is prepared by mixing oxide and carbonate powder of the component materials, which is then pressed into pellet form. The pellet is sintered in an air atmosphere, and is evaporated in an evaporator. The mixing ratio of the component materials has been determined experimentally.

Further, it has been found by the inventors, that for a $RE_1Ba_2Cu_3O_x$ type film, the raw materials yttrium oxide ($Y_2O_3$), barium carbonate ($BaCO_3$) and copper oxide (CuO), should first be mixed in an elemental atomic ratio of 1:2:3 for Y, Ba and Cu and sintered to form a compound of $Y_1Ba_2Cu_3O_x$. Then the sintered compound is powdered again, and mixed with supplemental powders of $Y_2O_3$ and Cu in amounts of 4-7 parts of $Y_2O_3$ and 1 part of Cu respectively, relative to 1 part of Ba. The mixed powder of these elements is sintered again.

For the Bi.Sr.Ca.Cu.O type film, such double sintering is unnecessary. The mixing ratio of the powdered component elements are found to have a rather wide range. The mixing ratio was 1 bismuth oxide (BiO): 2-3 strontium oxide (SrO): 3-30 calcium carbonate ($CaCO_3$): 2-5 copper oxide (CuO) in mole ratio.

Using a pellet formed by the above method as an evaporation source for electron beam evaporator, a film is formed a substrate made of MgO or $SrTiO_3$, and it showed a superconductivity at a liquid nitrogen temperature.

If a single electron beam power or a heating power is used for evaporating a single pellet which includes various materials having different vapor pressures relative to each other the above-mentioned shortage of the component materials in the superconductive film arises. According to the present invention, therefore, the predetermined component materials having a lower vapor pressure are added to the original mixture, which includes all component materials with a mixing ratio according to a chemical formula, in order to supplement the shortage of the elements in the formed film. For the $RE_1Ba_2Cu_3O_x$ compound, rare earth material (RE) and copper (Cu) are added. And for the Bi.Sr.Ca.Cu.O compound, Sr and Ca are added.

These and other objects, features and advantages of the present invention will be apparent from the following, more particularly, description of the preferred embodiments of this invention, as illustrated in the accompanying drawings.

DESCRIPTION OF PREFERRED EMBODIMENT

As described above, in ordinary methods for fabricating superconductive film by electron beam equipment, the component materials such as Y, Ba and Cu are loaded in respective crucibles in an evaporation chamber. They are independently, but at the same time, evaporated from each crucible toward a substrate, to form a superconductive compound on the substrate, or on the way from the source to the substrate. But the control of each element is very critical, and as the molecular formula $Y_1Ba_2Cu_3O_x$ shows, oxygen is required for forming the compound. Therefore, oxygen is introduced in the evaporation chamber to oxidize the elements. Still a shortage of oxygen is often found in the completed film. To supplement the shortage of oxygen, the film is annealed in an air or an oxygen atmosphere.

The inventors tried to evaporate an oxide of these element materials by electron beam, which is considered to overcome the shortage of oxygen in the deposited film. Encouraged by success in evaporating the oxide, the inventors tried to evaporate a mixture of oxide and carbonate of the component elements. The final method discovered by the inventors will be described with respect to preferred embodiments.

In a first embodiment, powders of $Y_2O_3$, $BaCO_3$ and CuO are mixed in a mixing ratio of 1:2:3 in ratio of Y, Ba, Cu and sintered to form a pellet having the following formula of $Y_1Ba_2Cu_3O_x$. The pellet is checked for superconductivity at a liquid nitrogen temperature. If this pellet is used as a source in the electron beam evaporator, the obtained film does not show superconductivity. Analysis of the film showed a shortage of Y and Cu. This is because $Y_2O_3$ and CuO have lower vapor pressures than BaO, which is converted from $BaCO_3$ by the prebaking and the sintering process. Then, the sintered pellet of $Y_1Ba_2Cu_3O_x$ is powdered again. This is designated as repowdering of the pellet, and powder of $Y_2O_3$ and a powder of metallic Cu is added to the repowdered pellet to compensate for the lower amounts of these elements which would otherwise be present in the film. Such a mixture is called a second mixture to distinguish it over the original mixture (called first mixture). The second mixture is also pressed, to form a pellet, and sintered. The conditions for forming these pellets are described below.

Figure 1:
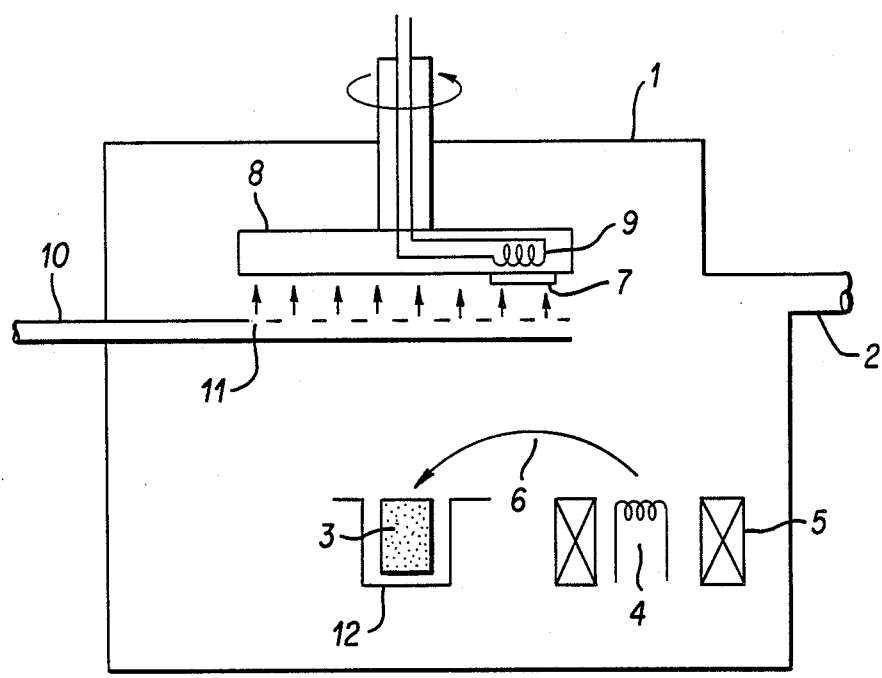
FIG. 1 is a schematic drawing illustrating an electron beam evaporator used for this invention.

A pellet prepared in such a way is placed in an electron beam evaporator. FIG. 1 shows schematically an electron beam evaporator used in this invention. Evaporation chamber 1 is evacuated through an exhaust pipe 2. The pellet 3 is placed in a crucible 12 in the evaporation chamber 1. Electrons are emitted from the filament 4 and focused by a magnet 5 on the source (pellet 3). The electron beam 6 is accelerated by an electric potential between the filament 4 and the pellet 3. A substrate 7 is supported by a rotatable holder 8. In the holder 8 a heater 9 is provided to heat the substrate 7. The evaporation chamber 1 is provided with an oxygen inlet pipe 10, which supplies oxygen around the substrate 7 through holes 11.

It is not understood why, but if the additional powder of $Y_2O_3$ and metallic powder of Cu is added to the source mixture from the beginning of pellet making, the formed film shows superconductivity only at the temperature of liquid helium, and does not show superconductivity at the temperature of liquid nitrogen. However, with a pellet which is prepared by the above procedure of repowdering, the formed film produced by evaporating the source or pellet shows superconductivity at the temperature of liquid nitrogen.

Though it is still not certain, and the inventors do not wish to be bound by any theory, the following explanation for such phenomenon seems plausible. If the source powder is added with supplemental powdered amounts of $Y_2O_3$ and powder amounts of metallic Cu at the beginning of pellet making, a rhombic perovskite structure is not obtained by sintering, because the mixing ratio is different from the ideal ratio of 1:2:3. Accordingly, if such a pellet containing supplemental amounts of $Y_2O_3$ and Cu is used as a source for the electron evaporator, the formed film contains only a relatively small amount of the rhombic perovskite structure, which is a structure essential for superconductive material. So, it is difficult to show superconductivity unless the formed film is cooled to the temperature of liquid helium. On the contrary, when the pellet is sintered using a mixed powder of $Y_2O_3$, $BaCO_3$ and CuO having a mixing ratio such that the atomic ratio of Y, Ba and Cu is 1:2:3, the sintered pellet will have a structure of the rhombic perovskite of $Y_1Ba_2Cu_3O_x$. This has been ascertained by X-ray crystallography. So, when such a pellet is powdered again, the powder maintains the rhombic perovskite structure, and the structure is transferred to the film. The added powders of $Y_2O_3$ and metallic Cu might be crystallized around the original seed crystal of $Y_1Ba_2Cu_3O_x$, covering the loss of Ba and Cu caused by electron bombardment.

Another reason considered is that, by the first sintering, which is carried on in an air atmosphere, carbon is completely removed. Carbon is undesirable for crystallizing $Y_1Ba_2Cu_3O_x$.

Next, the method for fabricating the source pellet will be described. A first mixture of

in mole ratio is prepared, and prebaked in an air at 800°–950° C. for 5–50 hours, preferably at 850° C. for 10 hours. The baked material is powdered, mixed and pressed in the form of pellet by 300 kgf/cm$^2$. The pellet is cylindrical, 3 cm in diameter and 3 cm high. The pellet is sintered in an air atmosphere at 900°–1,000° C. for 5–50 hours, preferably at 950° C. for 10 hours, and cooled slowly to a room temperature by cooling at a rate of 0.5° C/min, for example. By this sintering process, (called first sintering) the pellet becomes a sintered body of $Y_1Ba_2Cu_3O_x$ having a rhombic perovskite structure. And carbon which is undesirable for forming the crystal is removed.

Next, the pellet is powdered again (repowdered), and supplemental powder amounts of $Y_2O_3$ and metallic Cu are added in a mixing ratio of 4–7 parts of Y, and 1 part of metallic Cu powder for 1 part of Ba in the first mixture, each in atomic ratio of Y and Cu. And as explained above, the amount of the added supplemental elements depend upon the vapor pressure of the oxide of the added supplemental elements. The mixing ratio 4–7 for Y in the second mixture is also varied depending on the energy of the electron beam used for the evaporation. For a higher energy, the ratio is decreased to 4, and for a lower energy, the rate is increased to 7. That is, the lower the vapor pressure, the larger the amount of element should be added. After adding the supplemental elements to the repowdered pellet according to the above, the second powder is mixed well, pressed into pellet form and sintered. The sintering is carried on in an oxygen atmosphere at 450°–500° C. for 2–8 hours, preferably at 500° C. for 2 hours. This sintering is called second sintering, and a pellet prepared in such a way is called a repowdered pellet hereinafter to distinguish it from an ordinary (only once sintered) pellet.

Such a repowdered pellet is used for the source of an electron beam evaporator as shown in FIG. 1. The electron beam of 8.3 kV 100 mA was used for the repowdered pellet including a supplemental Y ratio of 6.5 parts per 1 part Ba, for example. For a higher electron beam energy, 9.0 keV for example, the ratio of supplemental Y is decreased to 4. The ratio of the supplemental Y is increased to 7 for lower electron beam energy of 6.5 keV for example. The repowdered pellet 3 was evaporated by the electron beam, and deposited on the substrate 7 which is supported by a holder 8 facing pellet 3. The evaporation chamber is evacuated to $1 \times 10^{-6}$ Torr, but the pressure in the chamber increased to $1 \times 10^{-5}$ Torr during the deposition, because oxygen is introduced into the chamber through the pipe 10. During the evaporation, the substrate is heated up to 600° C. by heater 9 provided in holder 8. The substrate made of sapphire, crystallized magnesium oxide, or strontium titanate is used. Under such conditions, the growing rate of the film of $Y_1Ba_2Cu_3O_x$ was about 5Å/sec.

The film was annealed in an oxygen atmosphere for two hours at 900° C. and for an additional 4 hours at 450° C. The film showed a superconductivity at the temperature of liquid nitrogen, 77° K.

The above embodiment is described with respect to a $Y_1Ba_2Cu_3O_x$ material. However, it is understood by one with ordinary skill in the art that the spirit of the invention can be applied to other types of materials having the same rhombic perovskite structure, by replacing the element atom of yttrium (Y) with other rare earth atoms, such as Sc, La, Nd, Sm, Gd, Dy, Ho, Er, Tm, Lu, Pm, Eu or Yb, by simple replacement of the element or modification of the process conditions.

In the above disclosure of the embodiment, the evaporation of the pellet has been accomplished using an electron beam evaporator, but it may be replaced by an electronic heater using a resistive filament.

Next a second embodiment of the present invention is set forth. In this embodiment, a method for forming a superconductive film composed of a (Bi.Sr.Ca.Cu.O) compound will be described. This compound is discovered to exhibit superconductivity at a higher temperature than $RE_1Ba_2Cu_3O_x$ compound, and is more stable against water. Further details about the (Bi,Sr,Ca,Cu.O) compounds are provided, for example, in "A New High-Tc Oxide Superconductor without a Rare Earth Element" by H. Maeda et al., *Japanese Jour. Appl. Phys.*, 27, No. 2, L209–L210 (1988).

The chemical formula of the compound is not certain, and therefore, the compound formula is written as (Bi.Sr.Ca.Cu.O). Accordingly, it is difficult to mix the component materials according to a chemical formula. Therefore, in a similar manner to the first embodiment, powders of $Bi_2O_3$, $SrCO_3$, $CaCO_3$ and CuO are mixed in an atomic ratio of (Bi:Sr:Ca:Cu 1:1:1:2) which is considered to be the ideal ratio of the superconductive material. However, by using such material as a source of the electron beam evaporator, it has been found that the film has the mixing ratio of (Bi:Sr:Ca:Cu 1:0.1:0.1:2). There is a great shortage of Sr and Ca, and the film does not show superconductivity. The reason for this occurrence is considered to be due to a lower evaporation rate of SrO and CaO, which are converted from $SrCO_3$ and $CaCO_3$ by the prebaking. So, these elements are added as the source of powder, and the optimum ratio of mixture is determined experimentally. The conditions found by the inventors are described below.

The pellet for the source of the electron beam evaporator was prepared by the following steps:

1. Powders of bismuth oxide ($Bi_2O_3$), strontium carbonate ($SrCO_3$), calcium carbonate ($CaCO_3$) and copper oxide (CuO) are mixed. The mixing ratio was 1:8:14:4 for atoms of Bi, Sr, Ca, Cu for Sample A, and 1:8:16:3 for Sample B.
2. The mixed powder was prebaked at 800°–870° C. for 5–50 hours, preferably at 850° C. for 3 hours in an air atmosphere.
3. The prebaked powder was powdered again, and pressed to form a cylindrical pellet 3 cm in diameter and 3 cm high.

4. The pellet is sintered in an air atmosphere at 850–880° C. for 5–50 hours, preferably at 850° C. for 10 hours.

In this embodiment the "repowdering" of the pellet is unnecessary. The evaporation condition for such a fabricated pellet was as follows:

- the electron beam energy was 300 W;
- the chamber was evacuated to $1 \times 10^{-6}$ Torr;
- the substrate of crystallized MgO or $SrTiO_3$ was heated up to 180° C. by the heater in the holder; and
- the holder of the substrate was rotated around its axis at a speed of 6–10 turns/min.

Under such conditions, the growth rate of the evaporated film was 7–8 Å/sec. The film was annealed in an air atmosphere at 850–880° C. for 3–120 min.

Chemical analysis showed the mixing ratio of the components of the film were as follows.

| Sample | Bi(atom) | Sr(atom) | Ca(atom) | Cu(atom) |
|--------|----------|----------|----------|----------|
| A | 1 | 0.85 | 0.67 | 1.65 |
| B | 1 | 0.51 | 0.63 | 1.17 |

These mixing ratios are not too similar to the ratio of Bi:Sr:Ca:Cu 1:1:1:2 in rhombic perovskite structure, but they are fairly similar to the ratio for a (Bi.Sr.Ca.Cu.0) compound known as:

1:1:1:1.5 for 110° K compound, or
1:1:0.5:1 for 80° K compound.

The resistivity of these films is measured by varying the temperature.

Figure 2C:
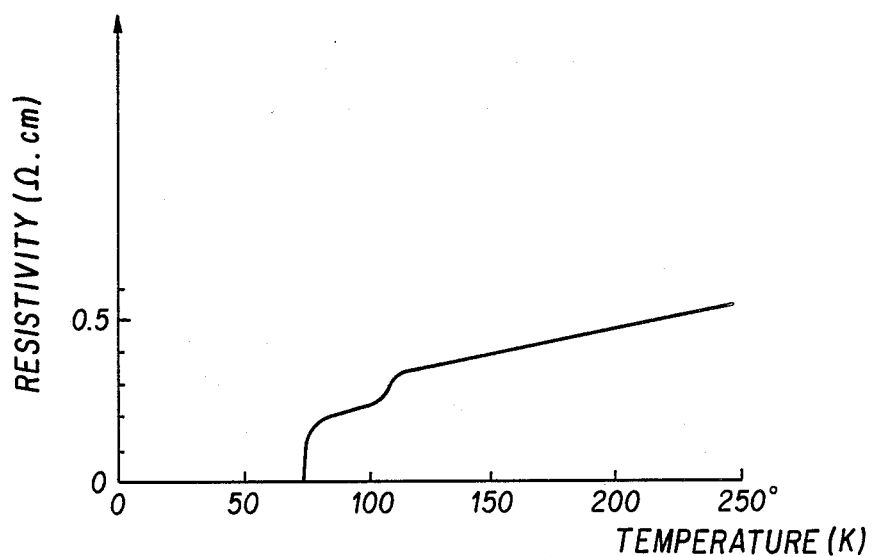
FIG. 2(c) is a graph showing temperature characteristics of resistivity of a Sample B formed on a $SrTiO_3$ substrate.
Figure 2A:
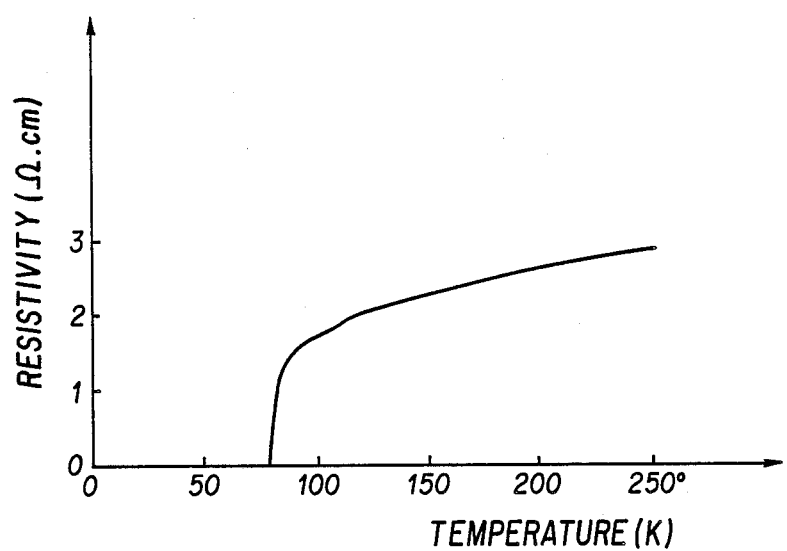
FIG. 2(a) is a graph showing temperature characteristics of resistivity of a Sample A which is formed on an MgO substrate.
Figure 2B:
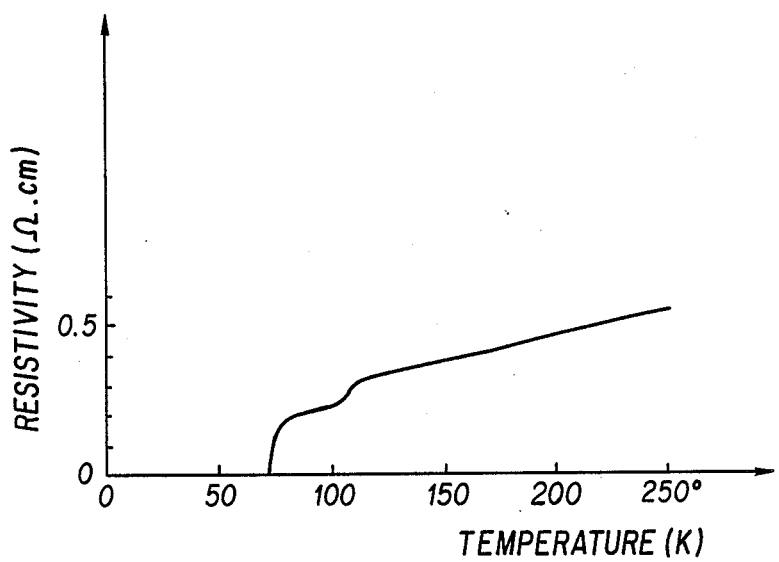
FIG. 2(b) is a graph showing temperature characteristics of resistivity of a Sample B formed on an MgO substrate.

FIG. 2(a) is a temperature dependency of the resistivity of Sample A formed on a MgO substrate;

FIG. 2(b) is a corresponding curve of Sample B formed on a MgO substrate; and

FIG. 2(c) is a curve for Sample B formed on a $SrTiO_3$ substrate. Each curve shows that resistivity sharply decreases to zero at nearly 80° K.

These curves show that the mixing ratio of the source material of Samples A and B, in which the atomic ratio of Sr and Ca is larger than the predetermined chemical formula ratio, compensates for what would otherwise be a shortage of Sr and Ca in the evaporated film of the (Bi.Sr.Ca.Cu.0) compound, and provide a superconductive film formed by electron beam evaporation.

In the above disclosure, an electron beam evaporator has been used for evaporating the pellet. However, it will be obvious that other types of heating devices, such as an electrically heated resistive filament, may be used.

As can be seen from above experiment, the source of the electron beam evaporator for fabricating the (Bi.Sr.Ca.Cu.0) compound does not need to be "repowdered" and a second sintering of the pellet, which was important in the first embodiment, is not needed. The reason is still not clear, but in repeating such an experiment, the range of mixing ratio of the component materials for forming a pellet which can provide a superconductive film has been investigated. The range is rather wide and is found to be one part of ($Bi_2O_3$), 3–15 parts of $SrCO_3$, 4–30 parts of $CaCO_3$ and 2–5 parts of CuO. If the mixing ratio is outside this range superconductive film cannot be formed.

As described above, it has been found that a superconductive film operable at a temperature of liquid nitrogen can be formed by an electron beam evaporator, using a source composed of a mixture of oxide and carbonate of component materials. The mixing ratio of the component material is different from a theoretical or predetermined mixing ratio, as it is necessary to supplement some elements to compensate for a shortage of some of the elements in the produced film, which is caused by a difference between the evaporation rates of elements. Further, it has been found that, especially for the compound $RE_1Ba_2Cu_3O_x$, preparation of the source pellet for the electron beam evaporator requires sintering the mixture of raw materials once with a mixing ratio according to the elemental ratios set forth in the chemical formula in order to grow a sintered rhombic perovskite structure. Then it is necessary to "repowder" it, and add the supplemental elements, and sintering the composition again.

What is claimed is:

1. A method of producing a superconductive film which comprises:

mixing powders comprising compounds of rare earth metal, barium and copper in elemental atomic ratios of 1:2:3 for rare earth metal, barium and copper, respectively;

pressing said first mixed powders into a first predetermined shape;

sintering said first shaped article in an atmosphere containing oxygen under conditions necessary to produce a first sintered shaped article having a rhombic perovskite crystal structure which exhibits superconductivity at liquid nitrogen temperatures;

comminuting said sintered shaped article;

mixing the comminuted particles with additional powder comprising at least one rare earth metal oxide and copper;

pressing said second mixed powders into a second shaped article;

sintering said second shaped article under an atmosphere containing oxygen;

subjecting said second sintered article to electron beam evaporation under an atmosphere containing oxygen to deposit a film thereof on a substrate and annealing said film under an atmosphere containing oxygen wherein the amount and composition of said additional powder is selected such that when said film is laid down it has a rhombic perovskite crystal structure and exhibits superconductivity at liquid nitrogen temperatures.

2. The method as claimed in claim 1 wherein said rare earth is yttrium.

3. The method as claimed in claim 2 wherein said additional powder comprises 4 to 7 part of yttrium and 1 part copper per part of barium.

4. The method as claimed in claim 1 wherein said rare earth is at least one member selected from the group consisting of Y, Sc, Nd, Sm, Gd, Dy, Ho, Er, Tm, Lu, Pm, Eu, and Yb.

5. The method as claimed in claim 1 wherein said film comprises $Y Ba_2 Cu_3 O_{6-7}$.

6. The method as claimed in claim 1 wherein said first sintering is carried out at about 900° to 1000° C. for about 5 to 50 hours, and said second sintering is carried out at about 450° to 500° C. for about 2 to 8 hours.

7. A method of making a superconductive film which comprises:

mixing powdered $Bi_2O_3$, $SrCO_3$, $CaCO_3$, and CuO in such quantities that the atomic ratios of Bi, Sr, Ca and Cu are 1:3−15:4−30:2−5 respectively;

baking said mixed powders at about 800° to 870° C.;

pressing said baked powder into at least one pellet;

sintering said pellet in air at about 850° to 880° C.;
evaporating said pellet into a film on a substrate; and
annnealing said film in air at about 850° to 880° C.

8. The method as claimed in claim 7 wherein said atomic ratio is respectively 1:8:14:4.

9. The method as claimed in claim 7 wherein said atomic ratio is respectively 1:8:16:3.2.

10. The method as claimed in claim 7 wherein said baking is carried out for about 5 to 50 hours, and said sintering is carried out for about 5 to 50 hours.

* * * * *